United States Patent [19]

Massit et al.

[11] Patent Number: 5,636,683

[45] Date of Patent: Jun. 10, 1997

[54] HEATING DEVICE FOR EMBODYING CONNECTIONS BY A MELTABLE MATERIAL

[75] Inventors: Claude Massit, Saint-Ismier; Gérard Nicolas, Voreppe; Guy Parat, Echirolles, all of France

[73] Assignee: Commissariat a l'Energie Atomique, France

[21] Appl. No.: 387,605

[22] Filed: Feb. 13, 1995

[30] Foreign Application Priority Data

Feb. 17, 1994 [FR] France ................................. 94 01818

[51] Int. Cl.$^6$ ................................................. F25B 29/00
[52] U.S. Cl. .......................... 165/48.1; 165/61; 165/80.4; 219/85.12; 219/121.6; 392/419
[58] Field of Search ....................... 165/61, 48.1, 80.4; 278/222, 180.22; 392/419; 219/85.12, 85.13, 457, 459, 462, 121.6, 121.63

[56] References Cited

U.S. PATENT DOCUMENTS

| | | | |
|---|---|---|---|
| 3,710,069 | 1/1973 | Papadopoulos et al. | 219/85 |
| 4,535,219 | 8/1985 | Sliwa, Jr. | 219/121 LC |
| 4,760,948 | 8/1988 | Spiecker | 219/85.13 |
| 4,812,620 | 3/1989 | Hayakawa et al. | 219/85.12 |
| 5,021,630 | 6/1991 | Benko et al. | 219/85.12 |
| 5,097,387 | 3/1992 | Griffith | 165/80.4 |
| 5,150,274 | 9/1992 | Okada et al. | 165/80.4 |
| 5,341,979 | 8/1994 | Gupta | 228/180.22 |
| 5,351,876 | 10/1994 | Belcher et al. | 228/180.22 |
| 5,460,320 | 10/1995 | Belcher et al. | 228/180.22 |
| 5,515,605 | 5/1996 | Hartmann et al. | 392/419 |

FOREIGN PATENT DOCUMENTS

| | | | |
|---|---|---|---|
| 85/03248 | 8/1985 | WIPO | 219/85.13 |
| 94/18701 | 8/1994 | WIPO | 228/180.22 |

OTHER PUBLICATIONS

Adachi, Kohei; "Packaging Technology for Liquid Crystal Displays", Solid State Technology, Jan. 1993, pp. 63–71.

Mori, Miki; et al., "A Fine Pitch COG Technique for a TFT–LCD Panel Using an Indium Alloy", Proceedings ECTC, 1993.

Tummala, Rao R.; et al., "Microelectronics Packaging Handbook", Jan. 1993, A Van Nostrand Reinhold Book, pp. 366–373.

Matsui, Koji; et al., "Resin and Flexible Metal Bumps for Chip–on–Glass Technology", Proceedings ECTC, 1993.

IBM Technical Disclosure Bulletin, vol. 32, No. 3A, Aug. 1989. pp. 453–455.

Primary Examiner—Edward K. Look
Assistant Examiner—Mark Sgantzos
Attorney, Agent, or Firm—Hayes, Soloway, Hennessey, Grossman & Hage, P.C.

[57] ABSTRACT

A heating device is provided for connecting by means of a melting material to a connection support at least one component mounted on the support in at least one connection region at the periphery of the support. The device locally heats the support and/or the component in the connection region. Particular utility for the present invention is found in the area of production of flat display screens, although other utilities are also contemplated.

18 Claims, 4 Drawing Sheets

HEATING DEVICE FOR EMBODYING CONNECTIONS BY A MELTABLE MATERIAL

FIELD OF THE INVENTION

The present invention concerns a heating device for embodying electrical and/or mechanical connections between one or several components to be connected and a connection support by means of a meltable material.

A component to be connected is understood to be an electronic component, such as an electronic chip, an electronic circuit or circuit portion, as well as a mechanical component, such as a large covering cap or sensor.

The device is particularly adapted to implementing a connection method by microballs known under the term "flip-chip".

It can be used in the field of integrated electronics for the production of flat panel display screens, such as liquid crystal screens, micropoint fluorescent screens and plasma screens. In fact, when producing these screens, electronic chips need to be connected to the screen, this connection being advantageously effected by mounting techniques.

BACKGROUND OF THE INVENTION

There are various techniques available to mount electronic chips and circuits. In the field for embodying flat screens, a distinction is made between COB (chip on board), COF (chip on flex) and COG (chip on glass) techniques.

These mounting techniques are used to mount on the border of flat screens electronic components for controlling the display of image points or pixels of the screen.

For reasons of simplification of the connections and within a wider integration perspective, the COG technique proves to be one most suitable for flat screens.

In the COG technique, which is a mounting of components on a glass structure, again several variants can be distinguished.

One of these variants is the glued COG technique which for the most part consists of a mounting of electronic chips by means of an elastomer. Although relatively inexpensive to implement, this variant poses problems linked to the individual mounting of the chips, the effectiveness of the mounting and the poor contact resistances and the problems of reliability in a humid atmosphere. The replacement of a chip is moreover almost impossible.

Another variant of the COG technique by means of thermocompression, apart from the problems of individual mounting of the chips and mounting efficiency, does pose problems linked to the pressures required to mount the chips, said pressures possibly generating microcracks in the integrated, circuits.

Furthermore, this technique involves the use of thin connection bosses which therefore limit the mechanical resistance of the chips, especially when the materials constituting the chips and that of the connection support have different thermal cubic expansion coefficients.

A further known technique is the COG wire bonding technique.

According to this variant, connection blocks of the component to be connected and blocks of the connection support are connected by means of wires. As each wire needs to be welded to two blocks, this technique does pose efficiency problems for multi-chip systems having a large number of contacts, and for encapsulating chips close to one another.

Moreover, the possible replacement of a defective chip proves to be particularly delicate.

Finally, so as to meet the requirement for increasing the number and complexity of the components or integrated circuits, as well as their operating frequency, a fourth variant for embodying mounting on COG glass is the one known as the SCOG (Solderable Chip on Glass) technique. It makes use of the "Flip Chip" technology for remelting bosses made of a meltable material.

The documents (1), (2), (3) and (4) referred to at the end of the description illustrate these various chip mounting variants.

Although the flip-chip technique seems to be particularly advantageous for mounting chips on flat screens as mentioned above, its use is not merely limited to mounting chips on glass, but may also concern the mounting of a chip in a casing, the mounting of chips on multichip modules or even on various sensors, for example.

An example of the flip-chip technique is shown diagrammatically on FIGS. 1A and 1B.

As shown on FIG. 1A, this technique initially consists of placing balls 2 made of a meltable metal and alloy on a first structure to be connected 4 on electric conductive blocks 6 made of a material able to be wetted by the material of the ball, and surrounded by an area made of a non-wettable electric nonconducting material.

For reasons of simplification, only one ball 2 is shown on FIG. 1. The structure 4 provided with balls 2 is mounted onto the connection support 10, also having conductive blocks 12 made of a wettable material, surrounded by an area 14 of a non-wettable nonconducting material and intended to receive the balls 2.

The structure 4 with the balls and the support 10 are heated to a temperature exceeding the temperature for melting the metal of the balls 2. This heating thus makes it possible to solder the blocks 6 on the blocks 12 by means of the balls, as shown on FIG. 1B.

The support 10 may be a casing, a substrate with integrated circuits, a sensor or a flat screen. Similarly, the structure 4 may be an electronic chip, a cap or another integrated circuit substrate. The balls 2 may moreover be replaced by disks made of a meltable material having the same function and may be disposed prior to soldering on the blocks 6 and also on the blocks 12.

The heating of both the support 10 and the structure 4 may take place either by convection, for example by a flow of hot air or in a through-oven, or by conduction, for example with the aid of a heating plate applied to the support 10, or even by radiation.

All these solutions generally result in a heating of all the elements (connection support 10 and structure 4) to a temperature exceeding the temperature for melting the metal or alloy of the ball.

Now, this temperature may be incompatible with certain members of the elements to be interconnected.

In particular, when the connection support forms part of a flat liquid display screen, the melting temperature of the balls is excessive.

By way of example, if the meltable metal of the balls is indium, the elements need to be heated to a temperature of about 180° C. which is incompatible with the maximum temperature supported by the liquid crystal cell, namely about 100° C.

One object of the invention is to also provide a heating device able to solder the chips or structures to be connected onto the connection supports, yet still being compatible with the maximum temperatures able to be supported by the structures using said supports, such as flat display screens.

SUMMARY OF THE INVENTION

The invention more particularly concerns a heating device for connecting by means of a meltable material onto a connection support at least one component mounted on the support in at least one connection region at the periphery of the support, wherein the device comprises means for locally heating the support and/or the component in the connection region, said heating means comprising a heating plate having at least one zone for transmission of heat via conduction to the connection support in the connection region, the transmission zone being fitted on a projecting portion of the plate projecting onto an approximately flat portion orientated towards the connection support so as to retain a film of protective thermal air between the approximately flat portion of the plate and the support outside the connection region.

By means of the device of the invention, it is possible to heat the elements to be connected only in the connection region by keeping the support outside the connection region and at a lower temperature and so that it does not alter any possible members associated with the support and sensitive to the heat. Furthermore, it is possible to simultaneously heat all the elements to be connected, which advantageously makes it possible to carry out all the connections in the same operation.

By virtue of its high thermal resistance, the film of air retained between the portion of the heating plate orientated towards the connection support and the connection support constitutes an insulation of the portion of the connection support which is not in contact with the heat transmission zone.

So as to further protect the members sensitive to the heat of the elements to be interconnected, a thermal screen made of a material, such as glass or ceramics, may be disposed in the film of air between the heating plate and the connection support.

So as to improve the thermal protection provided by the screen, according to one advantageous characteristic of the invention, said screen may comprise an internal channel for circulating a cooling fluid, such as air or water.

According to one advantageous embodiment, the device may further comprise means for supporting the connection support so as to ensure a flat contact between said support and the transmission zone, said means possibly being shims resting on the portion of the plate orientated towards the substrate.

The device further includes means for positioning the support on the transmission zone, such as support surfaces 127 disposed perpendicular to the transmission zone and fitted in the upper portion of the projecting portion of the plate and/or shims or means for securing the support to the plate.

So as to improve the thermal contact between the transmission zone and the support, the device may be equipped with a suction system which opens into the heat transmission zone.

The device of the invention may be embodied by implementing various means for transmitting heat to the elements to be interconnected. The heat may be transmitted by conduction as described above, but also by radiation or possibly by convection or via a combination of two or indeed the three heat transmission means.

Thus, according to one variant of the invention, the heating means may comprise at least one radiation source. Moreover, depending on the type of source used, the device may comprise a thermal screen disposed between the radiation source and the connection support.

The thermal screen comprises a protection plate disposed between the source and the support. A radiation passage window is then made in the plate opposite the connection region.

The plate advantageously has one reflecting surface on one face orientated towards the source.

The radiation source may be directed in the connection region either to the connection support or towards the component(s) to be connected, or even towards each of these portions. In addition, it is possible to combine heating via conduction, as described previously, with radiation heating.

Generally speaking, whether the radiation source is an infrared lamp or laser device, it is disposed in such a way as to heat as best and selectively as possible the connection region so as to melt the meltable material of the connection balls. In the case of a laser radiation source, the protective plate is not essential.

Where the connection support is a wall of a structure particularly sensitive to heat, such as a flat screen (liquid crystal cell, for example) and when the transmission of heat by the support itself risks damaging the sensitive structure, according to the invention, it is possible to apply close to or preferably on the heat sensitive structure one or several coolant fingers.

These fingers may comprise a cooling fluid and may possibly be cumulated with the other thermal protective means mentioned above.

BRIEF DESCRIPTION OF THE DRAWINGS

Other characteristics and advantages of the invention shall appear more readily from a reading of the following non-restrictive description given by way of illustration with reference to the accompanying drawings in which.

DETAILED DESCRIPTION OF THE PREFERRED EMBODIMENTS

Figure 1A:
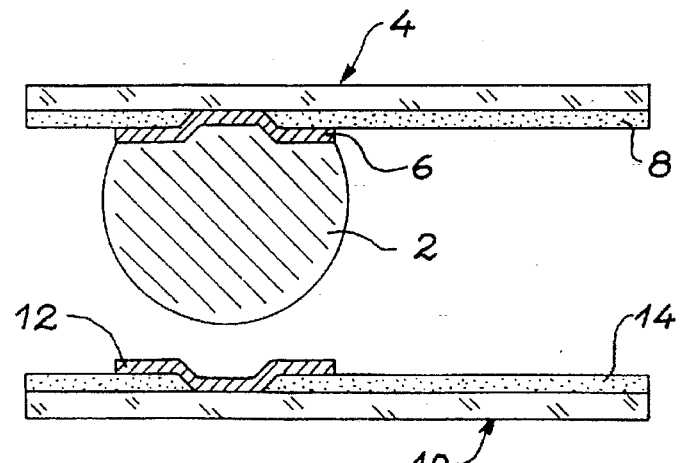
FIGS. 1A and 1B described above are partial large scale diagrammatic views illustrating an interconnection by balls made of a meltable material.
Figure 1B:
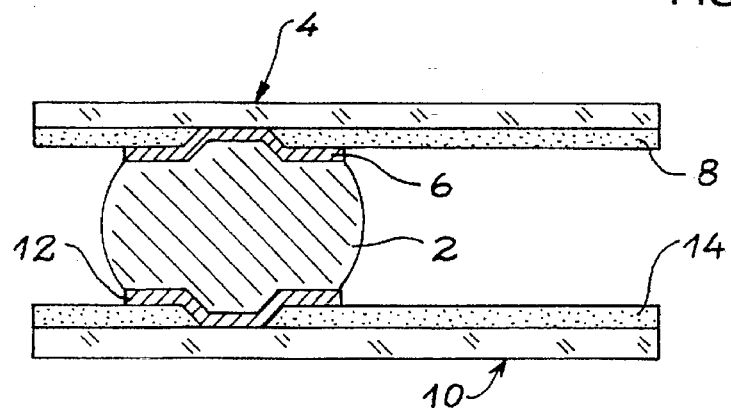
Figure 2:
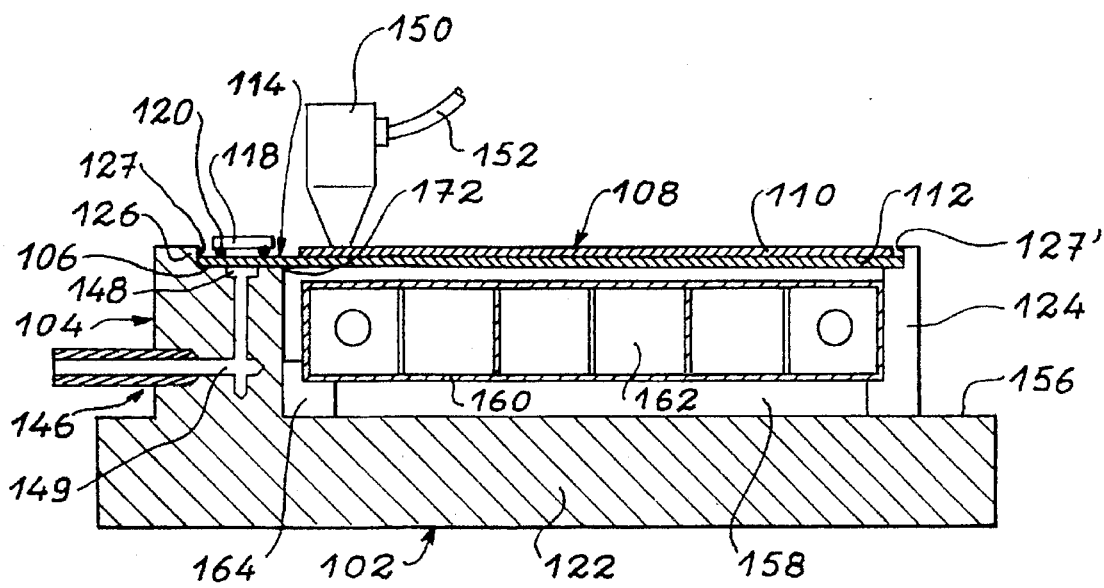
FIG. 2 is a section of a device conforming to the invention and according to a first variant.
Figure 3:
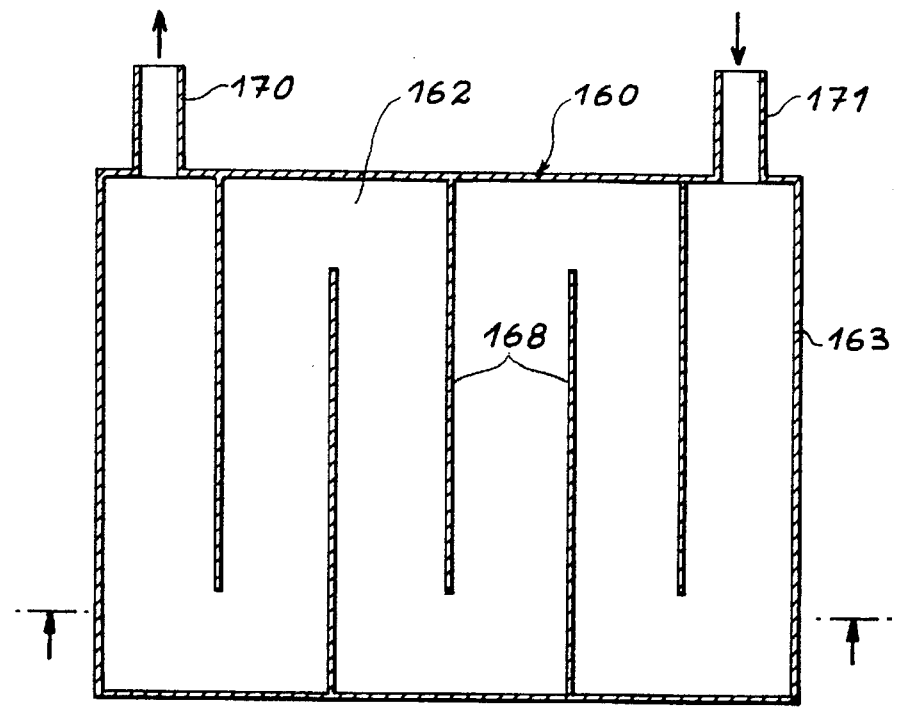
FIG. 3 is a cross section of a thermal screen of the device of the invention.

The device shown on FIGS. 2–3 comprises a heating plate 102 with a projecting portion 104 having a heat transmission zone 106. The plate may comprise either an internal heat source, such as an electric heating resistor (not shown), or be in contact with a heat source. The heating plate 102 is preferably made of a material possessing good heat conductivity. A metal, such as copper or brass, is suitable.

A flat display screen 108, such as a liquid crystal screen 110, includes a first and second wall, such as glass plates. The first wall constitutes a connection support substrate 112 disposed on the heating plate.

One portion of the substrate 112 designated per connection region 114 is in support against the heat transmission zone 106 fitted on the portion 104.

The heat transmission zone 106 transmits to the connection region where the components 118 are mounted a sufficient amount of heat to melt the material of the balls or connection disks 120. Depending on the case, the plate 102 may comprise one or several projecting portions 104 with one or several heat transmission zones 106.

On FIG. 2, the component 118 represents an electronic chip including circuits for controlling the display screen 108.

The screen 108 is kept approximately parallel to a horizontal flat portion 122 of the heating plate to which the portion 104 projects with the aid of one or several shims 124. So as to correctly position the screen, according to one particular embodiment, a support surface 127 of a border 126 disposed perpendicular to the zone 106 and a notch 127' on the shim 124 are provided.

So as to perfect the application of the connection region 114 of the support to the heat transmission zone 106 and reduce the thermal contact resistance between these parts, a suction device 146 is provided in the portion 104. The device 146 comprises a suction section 148 preferably opening at the ends of the zone 106 which is then grooved opposite the connection region. The suction section 148 is connected to a suction device (not shown) by a channel 149 in the projection 104. One or several "cold cooling fingers" 150 may moreover be placed in contact with the screen close to the connection region. They are able to cool the screen 108 outside the connection zone and avoid any transmission of heat via conduction in the screen 108. The finger 150 as shown preferably comprises a gas or cooling liquid circulation channel 152.

Between the face 156 of the portion 122 orientated towards the screen 108 and the support is a film of air 158 which constitutes a thermal screen. The high thermal resistance of the air film is used profitably to form an insulation of the screen 108.

So as to increase the effectiveness of thermal protection, according to one variant, a thermal screen 160 is disposed in the air film 158. The thermal screen 160 preferably comprises an internal channel 162 to make the air or water circulate so as to cool it. The thermal screen 160 is also supported and positioned by shims 124, 164.

FIG. 3, which is a cross section of the screen 160, shows in more detail the structure of the "thermal" screen 160.

The thermal screen 160 comprises an outer wall 163 and has internal chicanes 168 so as to increase the length of the distance covered by the channel 162.

(The chicanes may be partially open partitions connected to the wall 163).

Inlet and outlet orifices 171 and 170 respectively make it possible to connect the channel 162 to a water distribution network so as to cool the screen 160.

The thermal screen 160 is nevertheless not essential for functioning of the device. By way of example, table I gives heating measurements for the device where solely the film of air 158 is provided as a thermal screen. The measurements are made with a glass plate 112 having a thickness of 1.1 mm and for increasing thicknesses E of the film of air 158, the heating plate being adjusted to 200° C.

TABLE

| THICKNESS E in mm | INITIAL TEMPERATURE | MAX TEMP AT CENTER OF DISPLAY SCREEN | TIME TAKEN TO REACH MAX TEMPERATURE |
|---|---|---|---|
| 0 | 20° C. | 190° C. | 30 s |
| 1 | 20° C. | 135° C. | 3 mins |
| 3 | 20° C. | 110° C. | 4 mins |
| 5 | 20° C. | 100° C. | 6 mins |

According to the above table, it seems that an air thickness of 5 mm results in a maximum temperature at the center of the structure of 100° C. after 6 minutes.

This rise of temperature would only be 40° C. after 30 seconds of heating, which is sufficient time to solder the chips to the structure.

Figure 4:
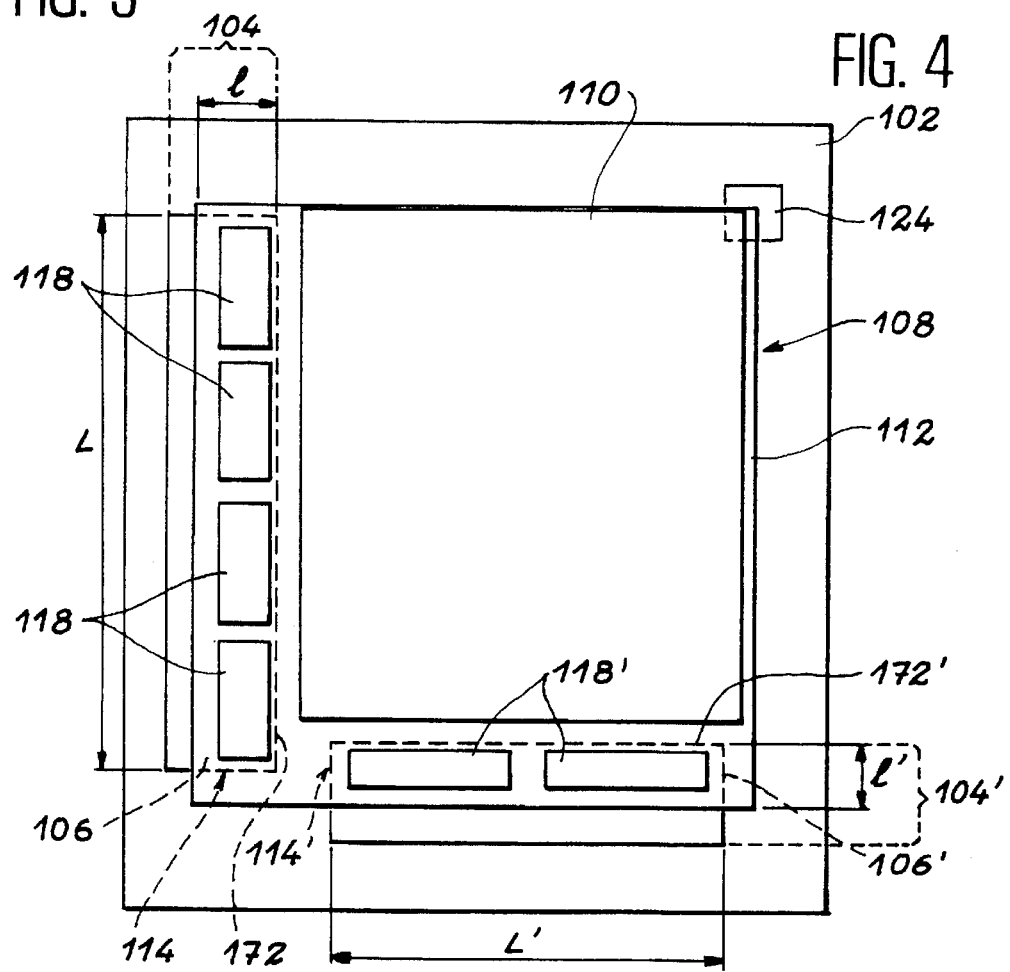
FIG. 4 is a simplified top view of the first variant of the device of the invention.

FIG. 4, which is a top view of the device, no longer shows the thermal screen for the sake of simplicity.

FIG. 4 shows a projecting portion 104 of the heating plate and having the shape of a square. Heat transmission zones 106 and 106' are in contact with connection regions 114 and 114' situated on the connection support 112 at the border of the wall 110.

As shown on FIG. 4 where four column chips 118 and two line chips 188' are mounted on the lower plate forming the connection support 112 of the flat screen 108, the zones 106 and 106' respectively have widths 1 and 1' larger than the width of the corresponding chips with edges 172, 172' virtually plumb with the edges of the chips. The lengths L aqnd L' of the zones; 106 and 106' are also slightly larger than the total length of the assembled chips.

By way of example for a support 112 measuring 5×3.5 cm² with four column chips 118 measuring 6×10 mm² and two line chips 188' measuring 3×10 mm², the dimensions of the zones 106 and 106' are respectively approximately 8×44 mm² and 4.5 ×23 mm².

FIG. 4 represents the connection of the chips on the same face of the screen. However, the invention can also be used for the connection of chips on both sides of a given screen respectively on each of these walls (110, 112) with one or several suitable heating devices being used to localize heating of the corresponding connection regions.

This is rendered possible by virtue of the connection by localized heating of both sides of the screen. On the other hand, the usual heating techniques used in the prior art could only carry out connections on a single side of the screen so as to avoid separating the connections disposed under the screen.

Figure 5:
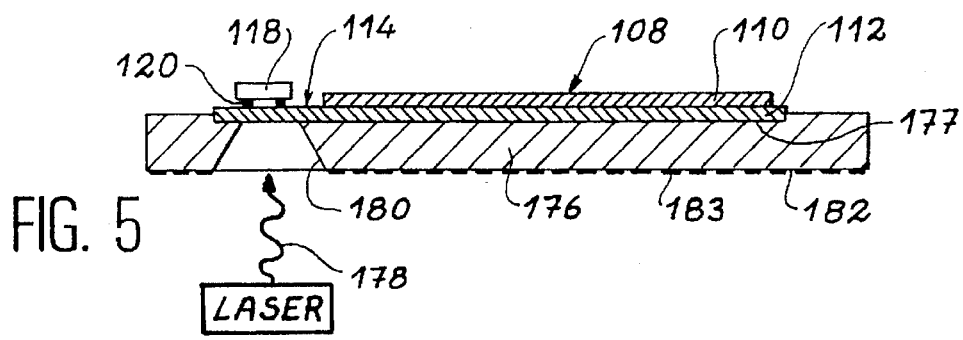
FIG. 5 is a section of a device conforming to the invention according to a second variant of the invention.

FIG. 5 shows a device according to another variant of the invention.

A flat screen 108 with a wall 110 and a connection support 112, similar to the screen 108 of FIG. 2, is placed on a thermal protective plate 176 situated between the screen 108 and a radiation source represented by the arrow 178, such as an infrared lamp (not shown). The thermal protective plate 176 comprises a support face 177 on which the connection support rests. This face is opposite the face 182 orientated towards the radiation source 178.

This plate supports the screen when it is intended to also support the screen, but otherwise it may be positioned close to the latter.

One or several windows 180 made in the plate 176 allowing for passage of the radiation are able to insulate the connection region(s) 114 of the screen 108 and heat the meltable material of the connection balls 120 of the component(s) 118 mounted in the region 114.

In this example, the connection support is exposed to radiation in the connection region. It is clear that the radiation may also be directed towards the components or chips 118. In this case, the plate 176 is situated on the other side of the screen 108.

The windows 180 provided to allow the radiation to pass through have an opening slightly larger than the surface of the components to be connected. Their widths are slightly larger than the width of the chips and their lengths are slightly larger than the total length of the assembled chips. By way of example, for chips and a screen of the type mentioned above, the width of the windows is respectively 6.2 mm and 3.2 mm for the column chips and for the line chips. The respective lengths are 42 mm and 21 mm.

The plate 176, made for example of stainless steel, preferably has on its face 182 orientated towards the radiation source 178 a coating 183 made of a material, such a gold, which is extremely reflecting to the wavelengths used, so as to avoid any significant heating of the notched portions of the display screen 108. The plate 176 may also be fully made of a reflecting material.

When the plate 176 has a thickness greater than or equal to 5 mm, it may be advantageous to widen the windows 180 by increasing their dimemsion opposite the radiation source so as to increase the heating luminous flow.

The radiation source 178 may include one or several luminous sources, such as halogen lamps preferably emitting infrared light.

According to another embodiment of the invention, the heating device comprises at least one laser source 300.

Heating is then effected without any protective plate by scanning a laser beam onto the chips. Heating may possibly take place through the support 112.

Figure 6:
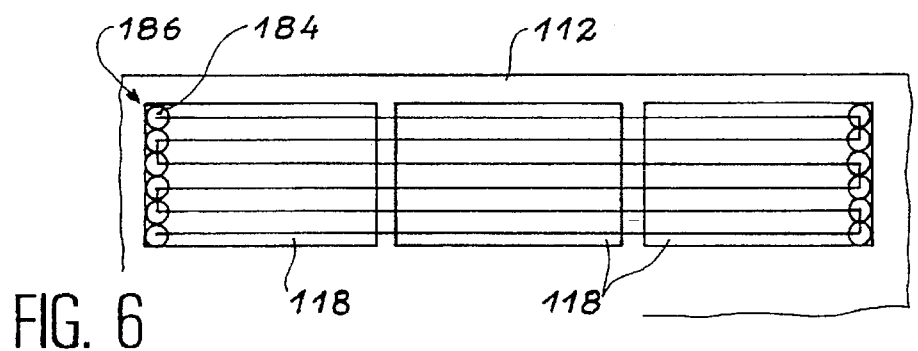
FIG. 6 is a diagrammatic representation of the electronic chip heating mode of the invention.

FIG. 6 shows an example of beam scanning. A beam 184 represented by a point moves lengthwise on all the "column" 118 or "line" 188' chips from a corner 186 of an end chip.

Having arrived at the opposing corner, the beam moves by a diameter of the beam along the axis perpendicular to the scanning and returns partially to the first scanning on the first chip and so on, until the entire surface of the chips is scanned.

Full scanning may be carried out several times until the desired temperature is reached.

This scanning is carried out by known means, either by moving the laser beam with the aid of mirrors mounted on galvanometers or with the aid of tables enabling the support to be heated to be moved.

Figure 7:
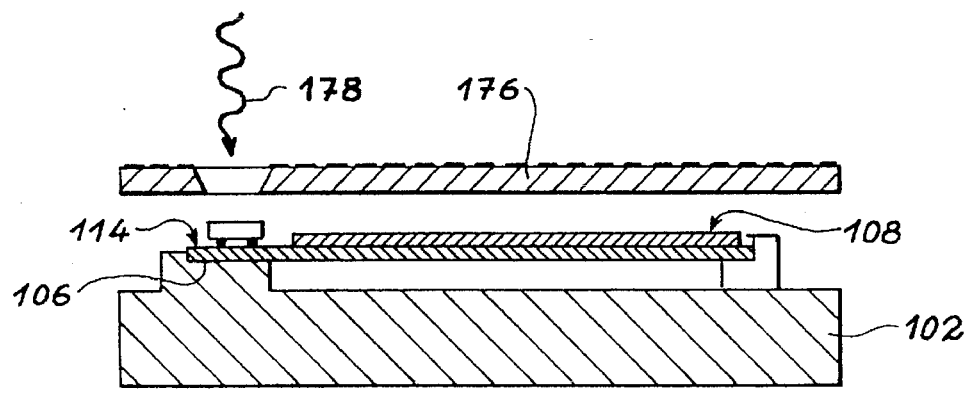
FIG. 7 is a section of a device cumulating the characteristics of the first and second variants of the invention.

FIG. 7 shows a device conforming to the invention and which cumulates the elements of the two preceding variants.

A flat display screen 108 is disposed on a heating plate 102 similar to that of FIG. 2 but not showing certain elements.

The connection region 114 of the screen 108 is heated, not merely by conduction with the heat transmission zone 106, but also by an infrared radiation represented by an arrow 178.

A thermal protective plate 176 is disposed between the radiation source and the flat screen 108. Note that in this case it is the face of the screen having the components or chips 118 which is orientated towards the radiation 178.

Figure 8:
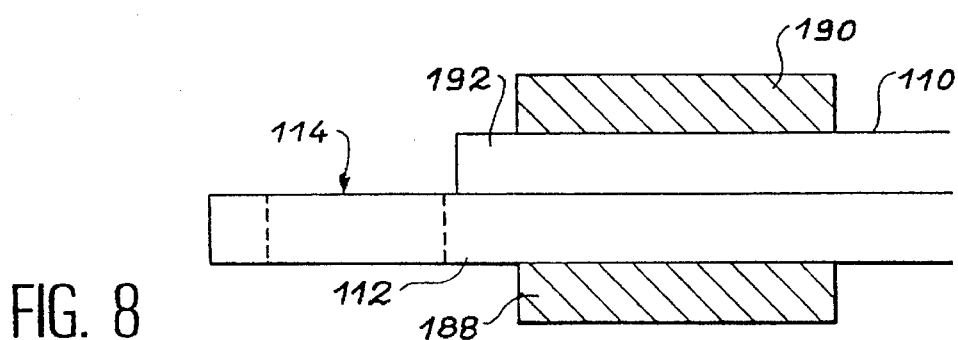
FIG. 8 is a section of a display screen equipped with cooling fingers in accordance with one characteristic of the invention.
Figure 9:
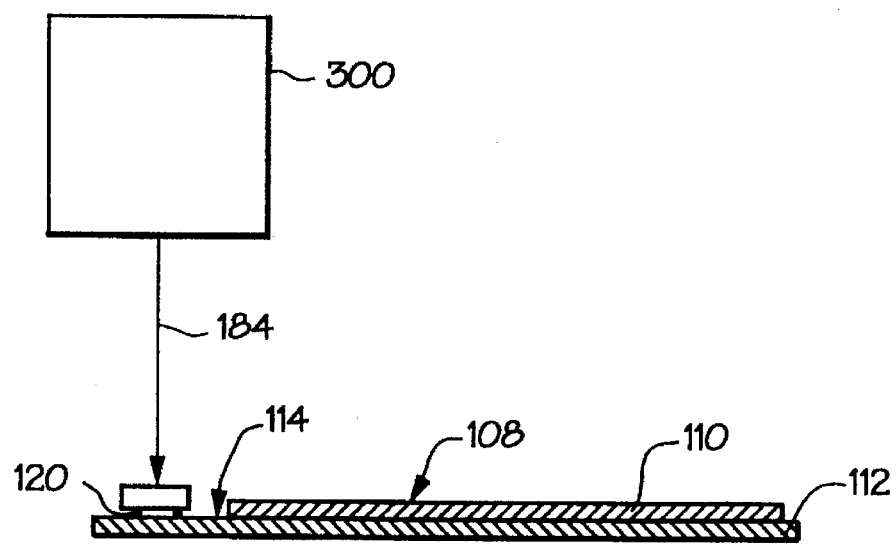
FIG. 9 is a sectional, schematic diagram of a device according to another variant of the invention.

For a particularly sensitive liquid crystal screen, a configuration, such as the one shown on FIG. 8, may prove to be necessary.

Two thermal fingers 188, 190, possibly similar to the finger 150 of FIG. 2, are respectively placed in contact directly on the walls of the screen 108.

The thermal fingers are preferably in contact with the screen, particularly close to the connection region 114.

By means of the invention, it is possible to effectively and quickly carry out mountings of components on connection supports, even if the latter comprise regions sensitive to heat.

Finally, the description gives by way of illstration the application of the invention to a flat screen, but of course the connection support may be different from a screen wall.

REFERENCES

Document (1):

"Packaging Technology for Liquid Crystal Display" by Kohei Adachi, Solid State Technology, January 1993, pp 63 to 71.

Document (2):

"A Fine Pitch COG Technique for a TFT-LCD Panel Using an Indium Alloy" by Miki Mori and A1, Proceedings ECTC 1993.

Document (3):

"Microelectronics Packaging Handbook" by Rao R. Tummlmala and E.J. Rymaszewski, January 1993, Van Nostrand Reinhold Book, pp 366 to 373.

Document (4):

"Resin and Flexible Metal Bumps for Chip-on-Glass Technology" by Koji Matsui and al., Proceedings ECTC, 1993.

What is claimed is:

1. A heating device for connecting by means of a meltable material on a connection support at least one component mounted on the support in at least one connection region at a periphery of the support, wherein the device comprises means for locally heating at least one of the support and the component in the connection region, the heating means comprising a heating plate having at least one heat transmission zone for transmitting heat via conduction to the connection support in the connection region, the transmission zone being in contact with said connection support and being provided on a projecting portion of the plate projecting onto an approximately flat portion oriented towards the connection support so as to retain a film of thermally protective air between the approximately flat portion of the plate and the support outside the connection region.

2. A device according claim 1, further comprising a thermal screen disposed in the air film.

3. A device according to claim 2, wherein the thermal screen includes an internal channel for circulating a cooling fluid.

4. A device according to claim 1, further comprising means for supporting the connection support to provide a flat contact between said support and the transmission zone.

5. A device according to claim 1, further comprising means for positioning the support on the transmission zone.

6. A device according to claim 1, further comprising a suction device opening in the heat transmission zone so as to firmly apply the connection support against the heat transmission zone.

7. A device according to claim 1, wherein the heating means includes at least one radiation source.

8. A device according to claim 7, further comprising a protection plate disposed between the source and the support with a window made in the protection plate opposite the connection region for passage of the radiation.

9. A device according to claim 8, wherein the protection plate has on one face oriented towards the source a reflecting surface.

10. A device according to claim 8, wherein the window has one opening that is at least as large as the surface of the component.

11. A device according to claim 7, wherein the radiation source comprises at least one infrared lamp.

12. A device according to claim 7, wherein the radiation source is directed towards at least one of the connection support and the component in the connection region.

13. A device according to claim 7, wherein the radiation source comprises at least one laser source.

14. A device according to claim 13, wherein the laser source is oriented for permitting transmission a beam towards the connection region and comprises means for scanning the connection region with the beam.

15. A device according to claim 1, wherein the connection source is a glass plate and the component mounted on the support is an electronic chip.

16. A device according to claim 1, wherein the connection support forms a wall of a flat display screen.

17. A device according to claim 1, further comprising at least one cooling finger in direct thermal contact with the support close to the connection region.

18. A device according to claim 1, further comprising at least one cooling finger in indirect thermal contact with the support close to the connection region.

* * * * *